(12) United States Patent
Sato et al.

(10) Patent No.: US 6,894,903 B2
(45) Date of Patent: May 17, 2005

(54) OPTICAL DATA LINK

(75) Inventors: Shunsuke Sato, Yokohama (JP); Naoki Nishiyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/084,662

(22) Filed: Feb. 28, 2002

(65) Prior Publication Data

US 2002/0126456 A1 Sep. 12, 2002

Related U.S. Application Data

(60) Provisional application No. 60/297,455, filed on Jun. 13, 2001.

(30) Foreign Application Priority Data

Feb. 28, 2001 (JP) .................... P2001-055582

(51) Int. Cl.[7] ................................. H05K 7/00
(52) U.S. Cl. ................. 361/728; 385/92; 361/753
(58) Field of Search ................. 361/728, 730, 361/733, 736, 742, 752, 753, 790, 796, 800–803; 439/65–75, 79–80, 620; 385/14, 88, 92–93

(56) References Cited

U.S. PATENT DOCUMENTS

| | | | | |
|---|---|---|---|---|
| 4,979,787 A | * | 12/1990 | Lichtenberger | 385/88 |
| 5,117,476 A | * | 5/1992 | Yingst et al. | 385/88 |
| 5,170,453 A | | 12/1992 | Go et al. | |
| 5,337,396 A | * | 8/1994 | Chen et al. | 385/92 |
| 5,416,688 A | | 5/1995 | Benzoni | |
| 5,434,747 A | * | 7/1995 | Shibata | 361/753 |
| 5,528,408 A | | 6/1996 | McGinley et al. | |
| 5,802,230 A | * | 9/1998 | Kuribayashi et al. | 385/92 |
| 6,234,686 B1 | * | 5/2001 | Tonai et al. | 385/88 |
| 6,364,543 B1 | * | 4/2002 | Fairchild et al. | 385/92 |
| 6,445,475 B1 | * | 9/2002 | Okubora et al. | 359/173 |
| 6,461,058 B1 | * | 10/2002 | Birch et al. | 385/92 |

FOREIGN PATENT DOCUMENTS

| | | |
|---|---|---|
| EP | 0 437 161 B1 | 7/1991 |
| EP | 0 448 989 A1 | 10/1991 |
| EP | 0 750 204 A1 | 12/1998 |
| WO | WO 94/01987 | 1/1994 |

* cited by examiner

Primary Examiner—David Martin
Assistant Examiner—Thanh S Phan
(74) Attorney, Agent, or Firm—McDermott Will & Emery LLP

(57) ABSTRACT

An optical data link 20 comprises a mounting member 22, an optical element assembly 24, a circuit board 26, and a spacer 32. The PGA substrate 22 has a substrate 22a and a plurality of electrically conductive pins 22b. The circuit board 26 has a pair of surfaces. Electronic components 34a to 34c are mounted on the pair of surfaces. The optical element assembly 24 includes a semiconductor optical element 24f. The semiconductor optical element 24f is connected to an electrically conductive layer on the circuit board 26. The spacer 32 functions so as to distance the circuit board 26 from the PGA substrate 22. Since the circuit board 26 is distanced from the PGA substrate 22, the electronic components 34a to 34e can be mounted on both surfaces of the circuit board 22.

5 Claims, 14 Drawing Sheets

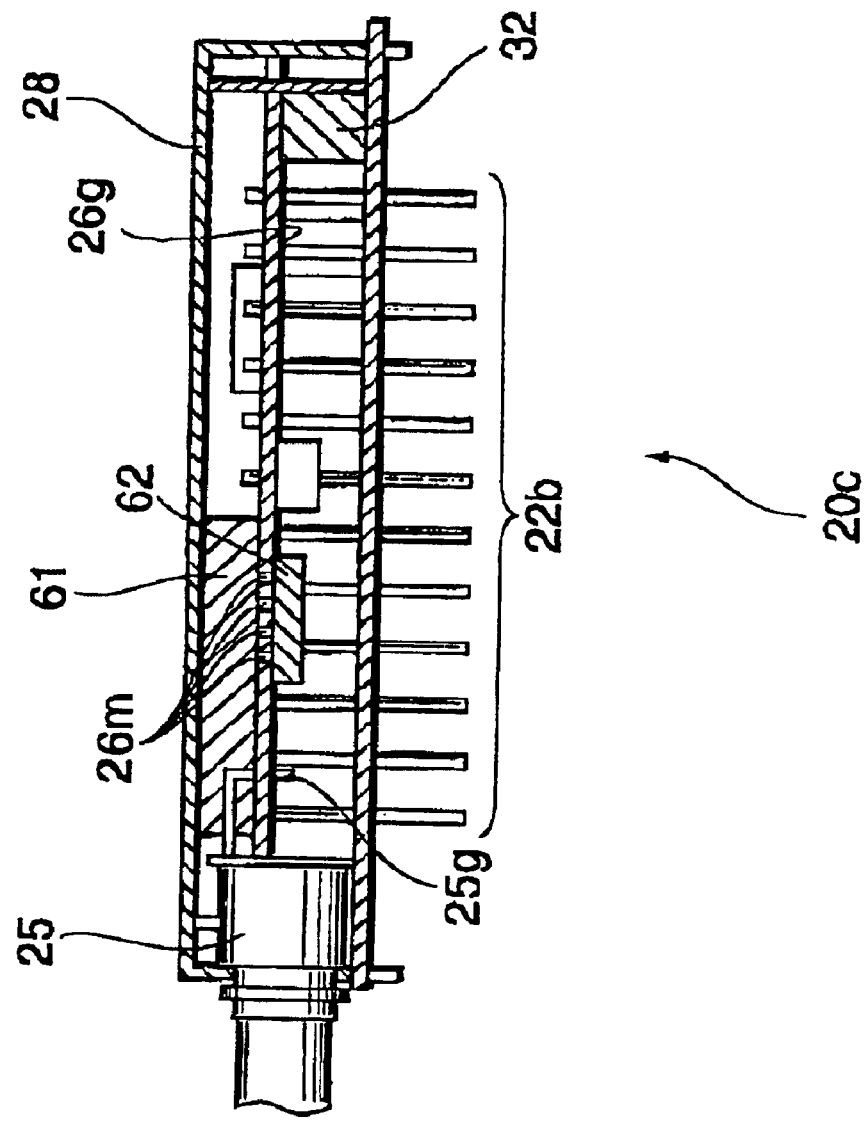

OPTICAL DATA LINK

CROSS-REFERENCE TO RELATED APPLICATION

This application claims priority to Provisional application Ser. No. 60/297,455 filed Jun. 13, 2001, which is/are hereby incorporated by reference in its/their entirety.

BACKGROUND ART OF THE INVENTION

1. Field of the Invention

The present invention relates to an optical data link.

2. Related Background Art

An optical data link has a photoelectric transducer unit, housing base member made of metal, a substrate directly secured onto this housing base member, and a cover member covering this substrate.

SUMMARY OF THE INVENTION

The inventor has been studied an optical data link as shown in FIGS. 15A, 15B, 16A, and 16B. In this optical data link, a printed circuit board 4 and a photoelectric transducer unit 6 are mounted on a housing base member 2 made of metal. The printed circuit board 4 is provided with lead terminals 8 supported by the metal-made housing base member 2. The printed circuit board 4 is covered with a cover 10, and the cover 10 is attached to the housing base member 2. The optical data link 12 as shown in FIG. 15B is constituted by these components.

Referring to FIG. 16A, the circuit board 4 is directly mounted on the housing base member 2 in the optical data link 12. The circuit board 4 is bonded by silver paste applied to the rear face of the circuit board 4. The whole rear face is utilized for the bonding by use of the silver paste. On the only one side of the circuit board 4, electronic components are mounted. In order to mount more electronic components on the circuit board 4, the circuit board 4 has been made greater to obtain additional area for mounting components.

Referring to FIG. 16B, the housing base member 2 of the optical data link 12 comprises a plurality of components such as a covar-made component 2a, a CuW-made component 2b, and a covar-made component 2c. These components 2a, 2b, 2c are assembled by silver brazing. The optical data link is composed of these components, so that the assembling of the optical data link is complicated. It is not easy to downsize the optical data link because of the large number of the components and the structural complexity of the optical data link.

In the development of the optical data link of this type, the inventor has found that the optical data link will hereafter be required to mount a greater number of electronic components than those currently mounted without increasing the size of optical data link.

Therefore, it is an object of the present invention to provide an optical data link having a structure capable of increasing area for mounting more electronic components thereon.

One aspect of the present invention relates to the optical data link. The optical data link comprises a mounting member, a circuit board, an optical element assembly, and support means. The mounting member has a substrate and a plurality of electrically conductive pins. The substrate has a plurality of holes. The electrically conductive pins pass through the plurality of holes of the substrate. The circuit board has a pair of surfaces. On each of the pair of surfaces, the circuit board mounts electronic components. The circuit board has, on each surface thereof, an electrically conductive layer connected to at least one of the plurality of electrically conductive pins. The optical element assembly includes a semiconductor optical element and is mounted on the mounting member. The semiconductor optical element is connected to the electrically conductive layer on the circuit board. The support means functions so as to distance the circuit board from the mounting member.

Another aspect of the present invention relates to the optical data link. The optical data link comprises a mounting member, a circuit board, an optical element assembly, and a support member. The support member is provided between the mounting member and the circuit board, and supports the circuit board so as to be spaced apart from the mounting member. Since the circuit board is spaced apart from the circuit board, both surface of the circuit board can be used for mounting the electronic components.

Since the circuit board is distanced from the mounting member, electronic components can be mounted on both surfaces of the circuit board.

The following features relating to the present invention can be combined with the above-mentioned invention. These features can be also combined with each other arbitrarily, whereby the invention obtained by these combinations can attain the operations and effects arising from the individual features as well as the combinations.

The optical data link may further comprise an electrically conductive cover covering the circuit board. One of the pair of surfaces of the circuit board faces a main surface of the mounting member. The mounting member has an electrically conductive film provided on the main surface. In this configuration, the circuit board is arranged between the electrically conductive cover and the electrically conductive film of the mounting member. This arrangement can improve the noise immunity of the optical data link.

In the optical data link, the mounting member may have an opening for accommodating an electronic component mounted on one of the surfaces of the circuit board. If the head of the electronic component is inserted into the opening, then the distance between the circuit board and the mounting member can be made smaller.

In the optical data link, both the mounting member and the circuit board may be arranged along a reference plane. The electrically conductive cover has a plurality of opening portions arranged so as to communicate with accommodating space between the mounting member and the circuit board. Each opening portion works as vent for communicating space between the mounting member and the circuit board to the outside of the optical data link.

In the optical data link, a support member may be mounted on the mounting member so as to support the optical element assembly and the circuit board. The circuit board is distanced from the mounting member by use of the support member supporting the optical element assembly.

In the optical data link, the circuit board may have a plurality of holes into which the electrically conductive pins are inserted. The circuit board is supported by at least one of the electrically conductive pins. The electrically conductive pins are provided so as to distance the circuit board from the mounting member.

In the optical data link, the mounting member may comprise an insulating member provided along a surface of the mounting member, and this surface is opposed to the main surface of the mounting member. The insulating member can electrically insulate the optical data link from a printed circuit board on which the optical data link is mounted.

In the optical data link, one side of the circuit board has a depressed portion. The optical element assembly may be arranged in this depressed portion. The depressed portion allows the length of the optical data link to decrease by a length corresponding to the depth of the depressed portion.

In the optical data link, one side of the circuit board has a depressed portion, whereas one side of the substrate of the mounting member has a depressed portion. The optical element assembly may be provided in these depressed portions. This configuration of the optical data link does not require the optical data link to have a sufficient height to accommodate the optical element assembly between the mounting member and the circuit board. Therefore, the height of the optical data link is reduced.

In the optical data link, the optical element assembly has an optical element mounting member, a plurality of terminals, a lens holding member, a lens, and a guide member. The following members may be arranged in the direction of a predetermined axis; the circuit board; an optical element mounting member; a semiconductor optical element; a lens holding member; a lens; and a guide member. The optical element mounting member mounts the semiconductor optical element. The optical element mounting member holds the terminals so as to be directed to the direction of a predetermined axis. The lens holding member is placed on the optical element mounting member so as to cover the semiconductor optical element. The lens is held in the lens holding member, The guide member is provided on the lens holding member.

Still another aspect of the present invention is the optical data link. The optical data link further comprises a semiconductor chip, a protection member, and a heat transfer part. The semiconductor chip is mounted on the circuit board spaced apart from the mounting member. The protection member exhibits electrical insulation and protects the semiconductor chip. There are the following embodiments of the optical data link that has the above structure.

In the optical data link, the means may include a support member provided between the mounting member and the circuit board. The support member supports the circuit board so as to be spaced apart from the mounting member. The heat transfer part is provided so as to contact the protection member and the optical element assembly. The heat transfer part serves to diffuse heat generated in the semiconductor chip and the optical element assembly.

In one embodiment, the semiconductor chip is provided between the circuit board and the electrically conductive cover. The heat transfer part is provided so as to contact the optical element assembly, the protection and the electrically conductive cover. The heat transfer part conducts heat generated in the optical element assembly and the semiconductor to the electrically conductive cover.

In another embodiment, the semiconductor chip is provided between the circuit board and the mounting member. The heat transfer part is provided so as to contact the protection member, the optical element assembly and the mounting member. The heat transfer part conducts heat generated in the optical element assembly and the semiconductor to the mounting member.

In still another embodiment, the semiconductor chip is provided between the circuit board and the mounting member. The circuit board comprises a thermal via in an area in which the semiconductor chip is provided. The heat transfer member is provided so as to contact the thermal via, the optical element assembly and the electrically conductive cover. The heat transfer part serves to conduct heat generated in the optical element assembly and the semiconductor to the electrically conductive cover through the thermal via.

In the optical data link, the heat transfer part is provided so as to contact an electric conductor connected with said semiconductor chip. The heat transfer part can receive heat generated in the semiconductor chip through the electric conductor.

In the optical data link, the heat transfer part has electrical insulation preventing electrical conduction from occurring therethrough.

In the optical data link, the heat transfer part exhibits flexibility to deform so as to conform to the shape of the protection member and optical element assembly when the heat transfer part is provided between the electrically conductive cover and the protection member and optical element assembly. The heat transfer part is deformed so as to increase contacting area between the heat transfer part and the protection member and optical element assembly. For example, the heat transfer part includes silicone ger material.

In the optical data link, the optical element assembly includes a semiconductor optical element. The semiconductor chip comprises circuit elements for driving said semiconductor optical element. The heat transfer part is used to conduct heat generated in the semiconductor chip and the optical element assembly to the outside of the optical data link.

In the optical data link, the protection member includes a package. The package houses the semiconductor chip.

In the optical data link, the protection member includes a resin. The resin is provided on the circuit board so as to cover the semiconductor chip therewith.

In the optical data link, the semiconductor chip is mounted on the circuit board by a flip-chip method.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above-mentioned object and other objects, features, and advantages of the present invention will be understood more easily from the following detailed description of preferred embodiments of the present invention set forth with reference to the accompanying drawings.

FIG. 13 is a cross sectional view, taken along a cross sectional line equivalent to the line II—II shown in FIG. 8, showing an optical data link;

DESCRIPTION OF THE PREFERRED EMBODIMENT

Figure 1:
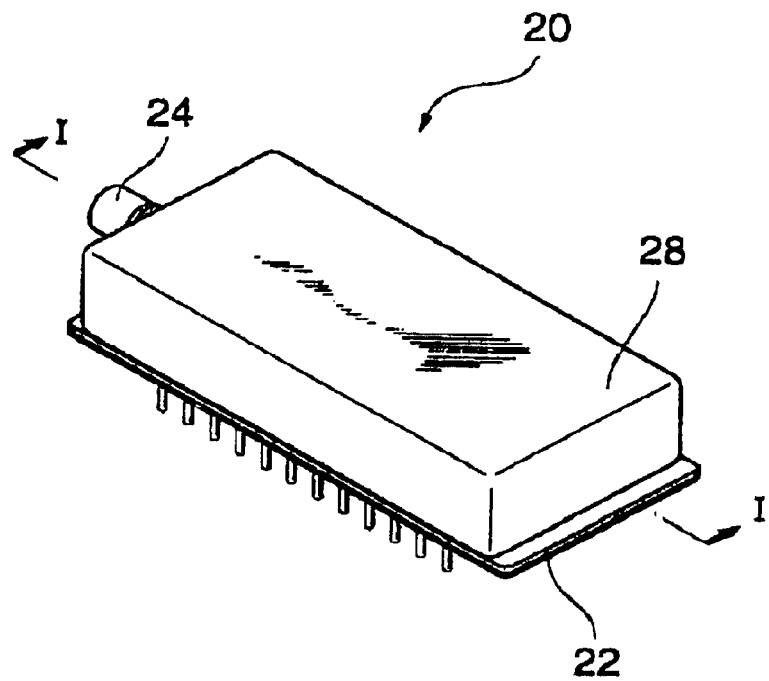
FIG. 1 is a view showing the appearance of the optical data link in accordance with an embodiment of the present invention.

The optical data links in accordance with embodiments of the present invention will be explained with reference to the drawings. Parts identical to each other will be referred to with reference numerals or letters identical to each other, if possible.

First Embodiment

Figure 2:
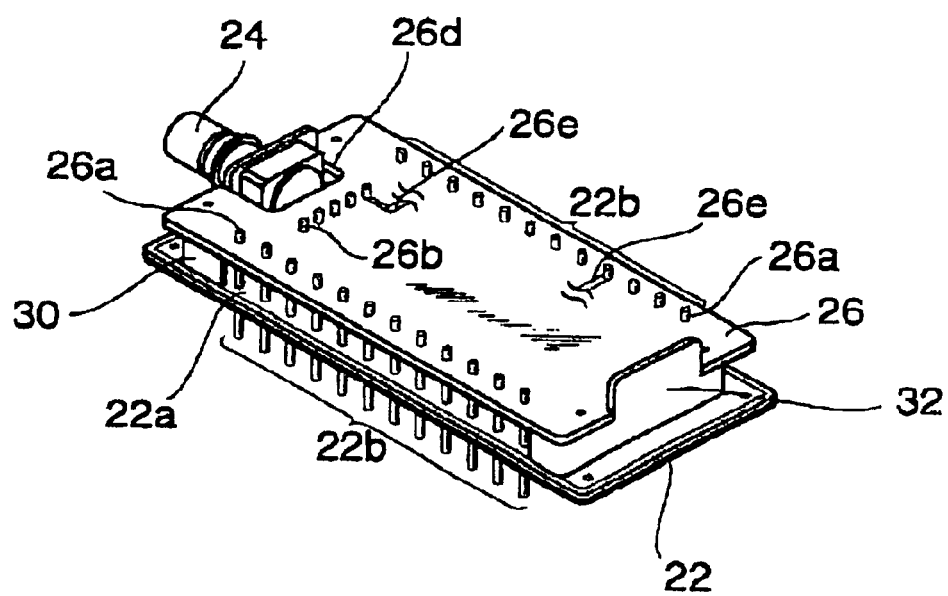
FIG. 2 is a view showing the inner structure of the optical data link in accordance with the embodiment of the optical data link.

FIG. 1 is a external view showing an optical data link in accordance with the embodiment, whereas FIG. 2 is a view showing the inner structure of the optical data link. FIGS. 1 and 2 show an optical data link 20. The optical data link 20 comprises a mounting member 22, an optical element assembly 24, a circuit board 26, and a cover member 28. The circuit board 26 is provided on the mounting member 22. The cover member 28 is provided on the mounting member 22. The circuit board 26 is provided between the mounting member 22 and the cover member 28. The optical element assembly 24 is supported by a first support member 30, such as a spacer. The first support member 30 is mounted on the main surface of the mounting member 22. According to this arrangement, the optical element assembly 24 is positioned on the mounting member 22 so as to be directed to a predetermined axial direction. The circuit board 26 can be supported by a second support member 32, such as a spacer. The second support member 32 is mounted on the main surface of the mounting member 22. This structure provides additional space for arranging electronic components between the circuit board 26 and the main surface of the mounting member 22. Also, the circuit board 26 may be supported by the first support member 30. The second support member 32 is provided away from the first support member. In an example as shown in FIG. 2, tho first support member 30 is disposed to face one of a pair of sides of the mounting member 22, whereas the second support member 32 is disposed to face the other of the pair of the sides of the mounting member 22. These sides intersect the predetermined axis.

Figure 3:
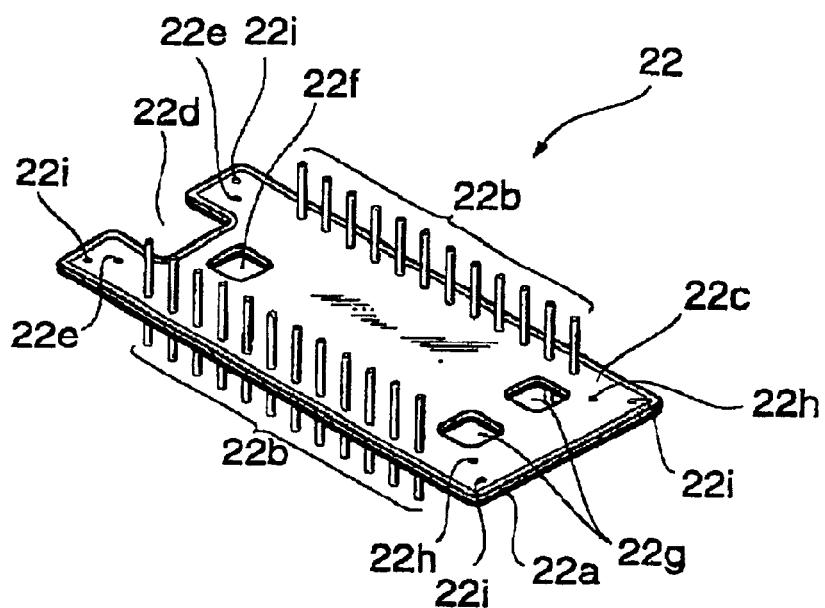
FIG. 3 is a view showing a mounting member for the optical data link.

FIG. 3 shows the mounting substrate. An example of mounting member 22 is a PGA (pin grid array) substrate. The mounting member 22 has a substrate 22a and electrically conductive pins 22b. The substrate 22a has a plurality of holes through which the electrically conductive pins 22b pass. The electrically conductive pins 22b are arranged in a pair of lines extending in the direction of a predetermined axis. These lines are arranged along the respective sides of the mounting member. These sides extend in the direction of the predetermined axis.

An electrically conductive film 22c is provided substantially over the whole main surface of the substrate 22a. The electrically conductive film 22c is connected to one pin of the electrically conductive pins provided to connect with a reference potential line. The substrate 22a has, at one side thereof, positioning holes 22e defining the position of the first support member 30.

Also, the substrate 22a has a cutout 22d provided so as to accommodate the tail of the optical element assembly 24. The optical element assembly 24 is supported by the first support member 30 positioned with respect to the positioning holes 22e while the optical element assembly 24 is disposed within the cutout 22d. The substrate 22a has positioning holes 22h, along one side of the substrate 22a, for defining the position of the second support member 32. The substrate 22a has one or a plurality of opening portions 22f and 22g. The positions of opening portions 22f and 22g are aligned with positions of electronic components mounted on the rear of the circuit board 26. The substrate 22a comprises through holes 22i for positioning the electrically conductive cover member 28. As can be seen from this explanation, the main parts are positioned with respect to the substrate 22a.

Referring to FIG. 2 again, the circuit board 26 has a plurality of through holes 26a into which the electrically conductive pins 22b are inserted The circuit board 26 has through holes 26b into which the terminals of the optical element assembly 24 are inserted. The optical element assembly 24 is held with the support member 30 while the terminals of the optical element assembly 24 are inserted in the through holes 22b. Although not totally illustrated, wirings are provided on the circuit board 26 and are made of electrically conductive layers 26c. The wirings extend to the surroundings of the plurality of through holes 26a and the through holes 22b. The electrically conductive pins 22b are inserted into the through holes 26a and the terminals of the optical element assembly 24 are inserted in the through holes 22b. These electrically conductive layers 26c are provided on both surfaces of the circuit board 26, respectively.

One side of the circuit board 26 is provided with a cutout 26d provided so as to extend in the direction of the predetermined axis. The cutout 26d is provided so as to accommodate the tail of the optical element assembly 24. The optical element assembly 24 is provided within the cutout 26d and is connected to the electrically conductive layers 26c of the circuit board 26.

Figure 4:
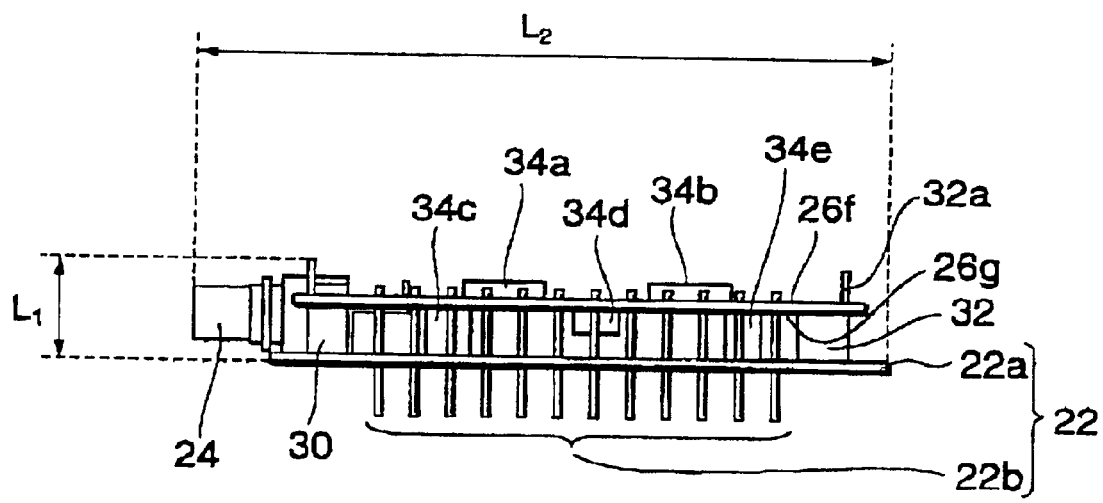
FIG. 4 is a view showing a side of the optical data link shown in FIG. 2.

FIG. 4 is a side view showing the optical data link with the cover member 28 removed therefrom. In the optical data link 20, the optical element assembly 24 is provided within both cutouts 26d and 22d. This configuration of the optical element assembly 24 allows the reduction of the height $L_1$ of the optical data link 20, and allows the reduction of the length $L_2$ of the optical data link 20 in the direction of a predetermined axis.

Referring to FIG. 4, electronic components 34a to 34e are arranged on a pair of surfaces 26f and 26g of the circuit board 26. The electronic components 34a and 34b are mounted on the first mounting surface 26f of the circuit board 26. The electronic components 34a and 34b are electrically connected to the optical element assembly 24 or electrically conductive pins 22b by way of an electrically conductive layer 26e. The electronic components 34c to 34e are mounted on the second mounting surface 26g of the circuit board 26. The electronic components 34c to 34e are electrically connected to the optical element assembly 24 or electrically conductive pins 22b by way of the electrically conductive layer 26e. The heights of the electronic components 34c, 34d and 34e are higher than those of the electronic components 34a and 34b. This configuration allows the reduction of the distance between the circuit board 26 and the cover member 28, so that the height $L_1$ of the optical data link 20 can be reduced. The head of the electronic component 34c is inserted in the opening portion 22f of the substrate 22a, whereas the head of the electronic component 34e is inserted in the opening portion 22g of the substrate 22a. Thus, the heights of electronic components 34c and 34e are not restricted by the interval between the circuit board 26 and the substrate 22, and the height $L_1$ of the optical data link 20 can be reduced.

Figure 5:
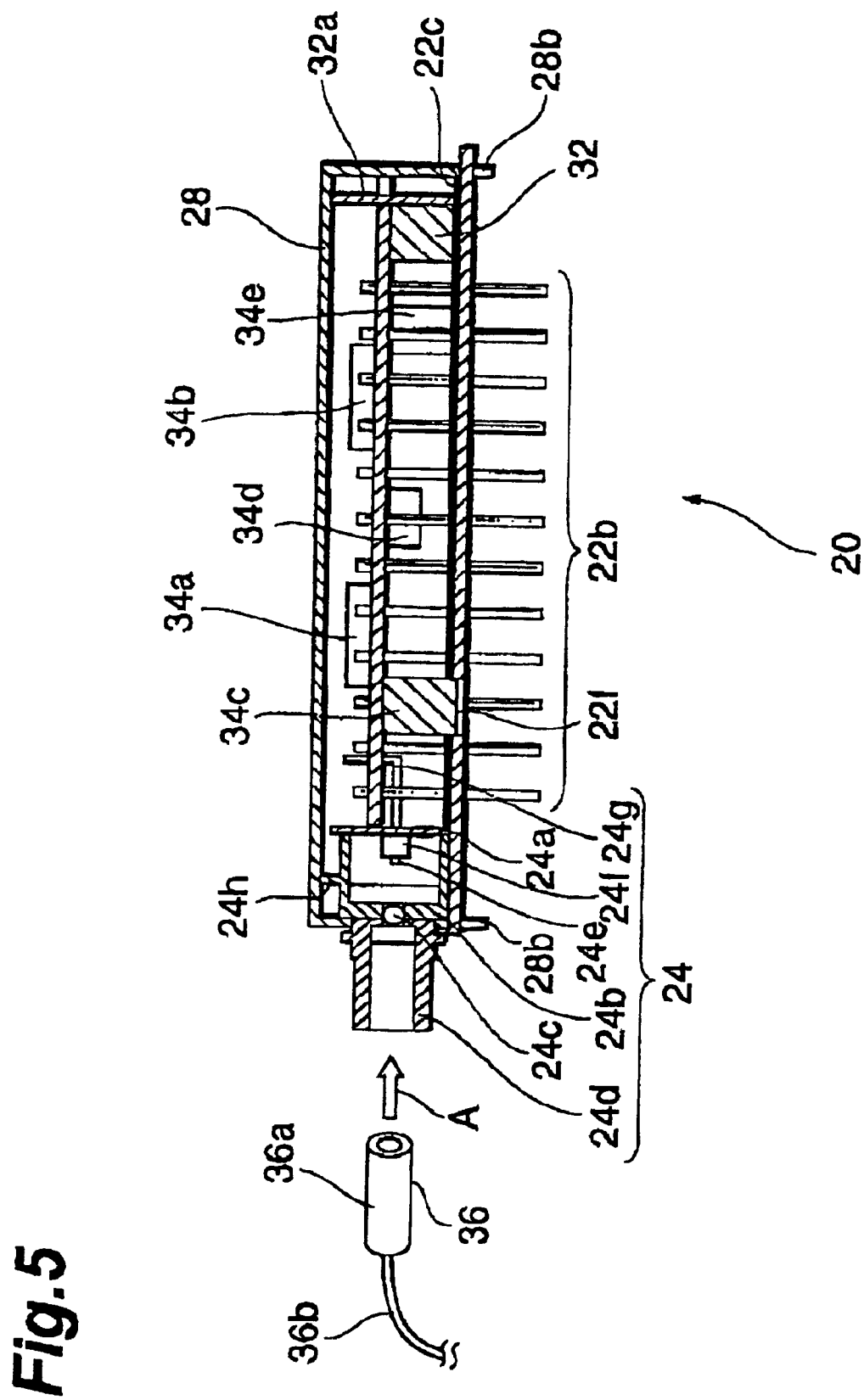
FIG. 5 is a cross sectional view, taken along the line I—I shown in FIG. 1, showing the optical data link.

FIG. 5 is a sectional view taken along the line I—I of FIG. 1 and shows the optical data link 20. A positioning portion 28b of the electrically conductive cover member 28 is inserted into a hole 22i of the substrate 22a, whereby the cover member 28 is positioned and secured to the mounting member 22. The optical element assembly 24a and the electronic components 34a to 34e are covered with the electrically conductive cover member 28, whereas the electrically conductive film 22c is provided on the main surface of the substrate 22. These electrically conductive parts shield the optical element assembly 24 and the electronic components 34a to 34e from external noises.

The optical element assembly 24 comprises: an optical device mounting member 24a, such as a stem; a lens holding member 24b; a lens 24c hold with the lens holding member 24b; and a guide member 24d, such as a sleeve. The optical element mounting member 24a, lens holding member 24b, lens 24c, and guide member 24d are arranged in the direction of a predetermined axis. One end of the lens holding member 24b is provided on a surface of the optical element mounting member 24a The guide member 24d is provided on the other end of the lens holding member 24b. The guide member 24d defines a direction in which an optical coupling device, such as an optical connector, is to be inserted. A mounting portion 24e for mounting a semiconductor optical element 24f projects from the preparing surface of the optical element mounting member 24a. The semiconductor optical element 24f is placed on the mounting portion 24e so as to align with the direction of the predetermined axis, so that the semiconductor optical element 24f is aligned with the optical axis of the optical data link 20. The semiconductor optical element 24f is electrically connected to a terminal 24g provided in the optical element mounting member 24a. The optical data link of this configuration allows the electrical connection of the semiconductor optical element 24f to the electronic components 34a to 34c arranged on the circuit board 26.

If the semiconductor optical element 24f is a semiconductor light emitting device such as a semiconductor laser, the optical data link 20 acts as a transmitter data link If the semiconductor optical element 24f is a semiconductor light receiving device such as a photodiode, the optical data link 20 acts as a receiver data link. In the optical data link 20, an optical connector 36 is inserted along the guide member 24d in the direction of arrow A. The optical connector 36 comprises a ferrule 36a and an optical fiber 32b, one end of which appears at one end of the ferrule 36a.

In the optical element assembly 24, the optical element mounting member 24a, lens holding member 24b, and guide member 24d are made of an electrically conductive material such as metal. The optical element assembly 24 is disposed so as to come into contact with the electrically conductive layer 22c and then is electrically connected to the electrically conductive layer 22c of the substrate 22. Further, the optical element assembly 24 comprises a connecting portion, such as an electrically conductive protrusion 24h. The protrusion 24h is provided on a side surface of the optical element assembly 24 so as to come into contact with the electrically conductive cover member 28. The optical data link of this configuration allows the electrical connection of the housing of the optical element assembly 24 to the electrically conductive cover member 28. The electrically conductive protrusion 24h of the optical element assembly is effective in improving the noise immunity of the optical data link 20.

The second support member 32 has an electrically conductive portion 32a, such as a metal plate and a metal pin. The electrically conductive portion 32a is provided so as to electrically connect the electrically conductive film 22c and the electrically conductive cover member 28 to each other when the second support member 32 is mounted on the mounting member 22. The optical data link of this configuration allows the electrical connection of the electrically conductive member 28 to the electrically conductive film 22c of the substrate 22. The electrically conductive portion 32a of the second support member 32 improves the noise immunity of the optical data link 20.

The first support member 30 may have an electrically conductive portion, such as a metal plate and a metal pin, whose shape is equivalent or similar to that of the second support member 32. This electrically conductive portion is provided so as to connect the electrically conductive film 22c with the electrically conductive cover member 28 when the first support member 30 is placed on the mounting member 22. This improves the noise immunity of the optical data link 20. The first support member 30 comprises an electrically conductive portion for connecting the housing of the optical element assembly 24 with the electrically conductive film 22c when the optical data link 20 is placed on the first support member 30.

Second Embodiment

Figure 6:
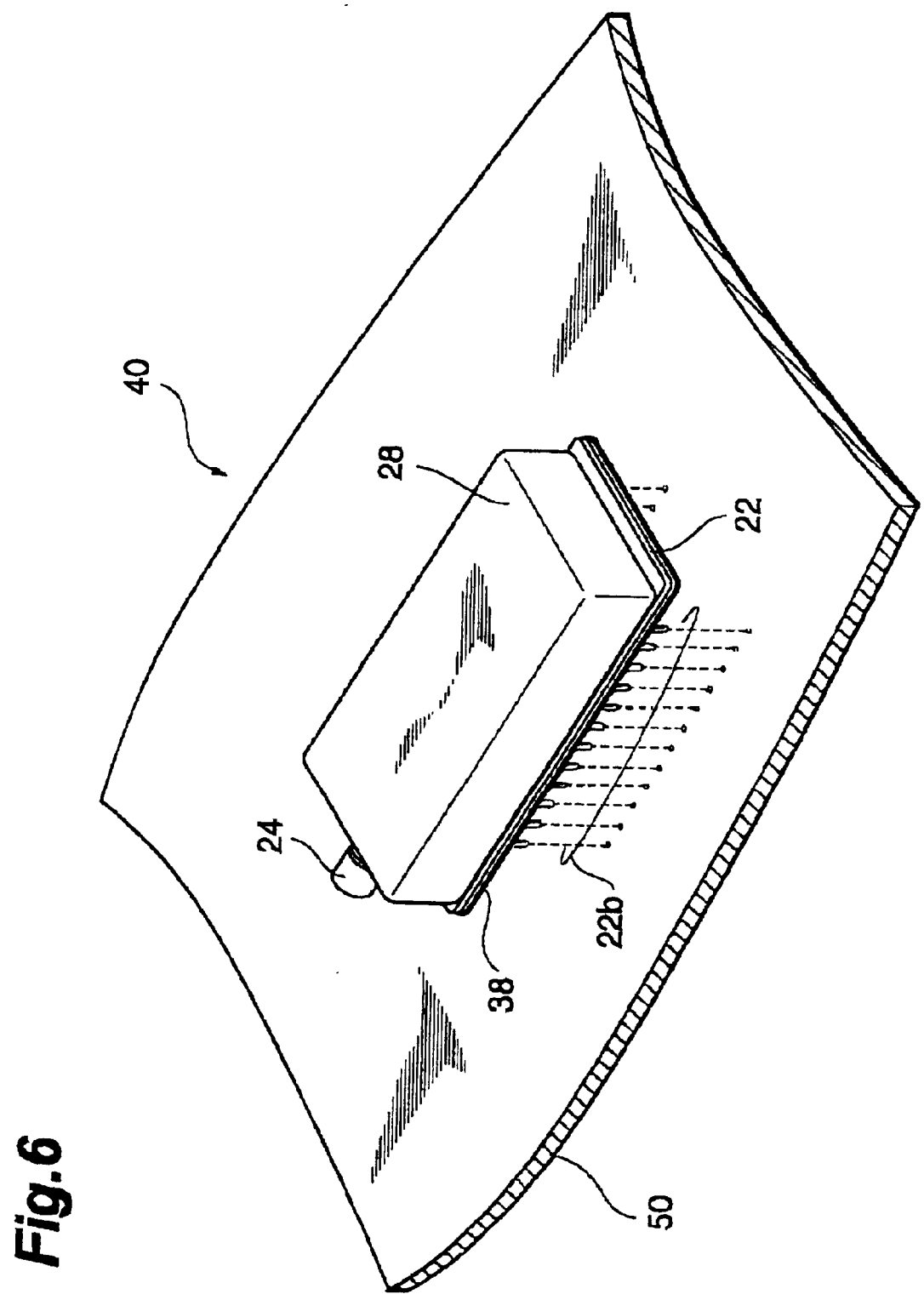
FIG. 6 is a view showing the appearance of the optical data link in accordance with another embodiment.

FIG. 6 is a perspective view showing the optical data link in accordance with another embodiment. This optical data link 40 further comprises an insulating member 38, such as an insulating sheet. The insulating member 38 is provided along the rear face of the substrate 22. The insulating member 38 can prevent unpredictable electric short-circuits from occurring in mounting the optical data link 20 on a printed circuit board 50.

Third Embodiment

Figure 7:
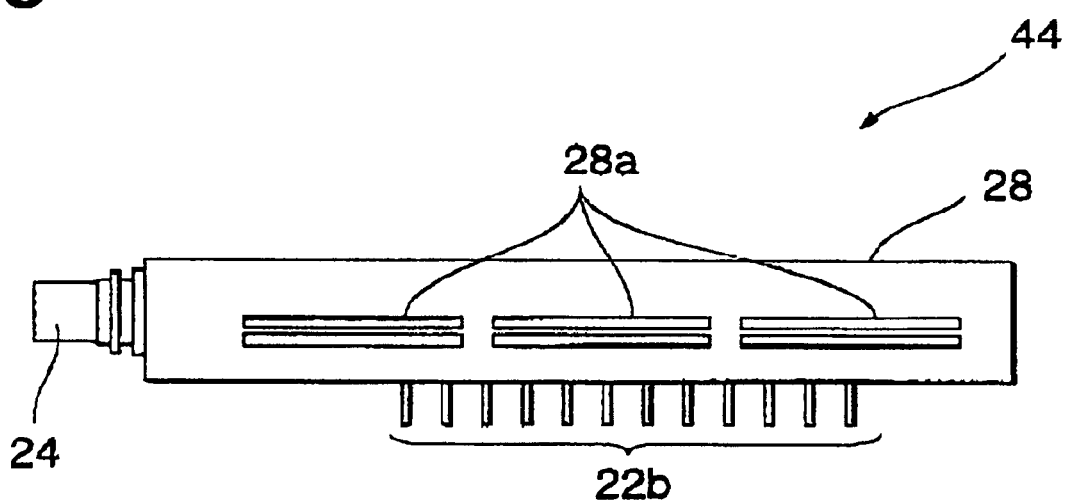
FIG. 7 is a view showing the optical data link in accordance with still another embodiment.

FIG. 7 is a side view showing the optical data link in accordance with still another embodiment. In this optical data link 44, the cover member 28 has one or a plurality of opening portions 28a. In the example shown in FIG. 7, the opening portions 28a are arranged in sides of the cover member 28. The opening portions 28a enable the ventilation with the inside of the optical data link 44. In this configuration, heat is generated from the electronic components and optical element assembly and can be released efficiently through the openings. The position of the opening portions 28a are aligned with a position between the substrate 22 and the circuit board 26. Even when the mounting density of electronic components is enhanced by the double-sided mounting, the heat from the electronic components can be released. Further, the opening portions 28a may be arranged in the direction of the predetermined axis and each opening portion may have a shape extending in the direction. In this configuration, the generated heat can efficiently be released through a region between the substrate 22 and the circuit board 26.

As explained in detail with reference to the drawings in the foregoing, mounting areas for electronic components are provided on both sides of the circuit board. As a consequence, these electronic components can be mounted on both surfaces of the circuit board. Therefore, the optical data link of this configuration allows the downsizing of the circuit board, and is effective in making the optical data link smaller.

Without using a sheet metal component as the housing base of the optical data link, the mounting member equipped with electrically conductive pins is used. The structure of the mounting member is simpler than that of the sheet metal, and is effective in reducing the cost of the optical data link.

The mounting substrate has an electrically conductive film therein or thereon and this film can block external noises. The optical data link made by the inventor has yielded noise immunity characteristic identical to or higher than the optical data link manufactured with a sheet metal component.

Fourth Embodiment

Figure 8:
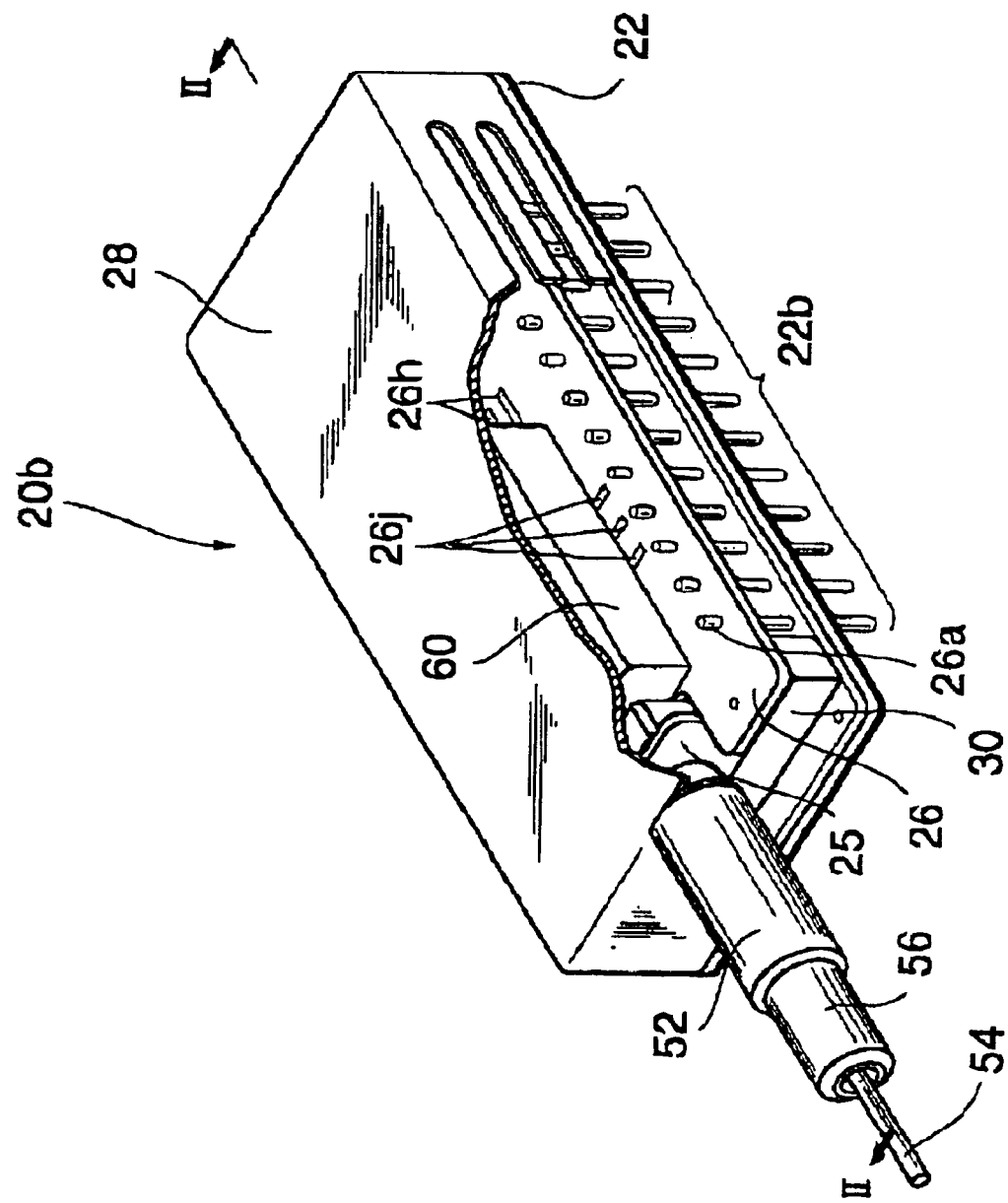
FIG. 8 is a perspective view showing an optical data link according to the fourth embodiment.
Figure 9:
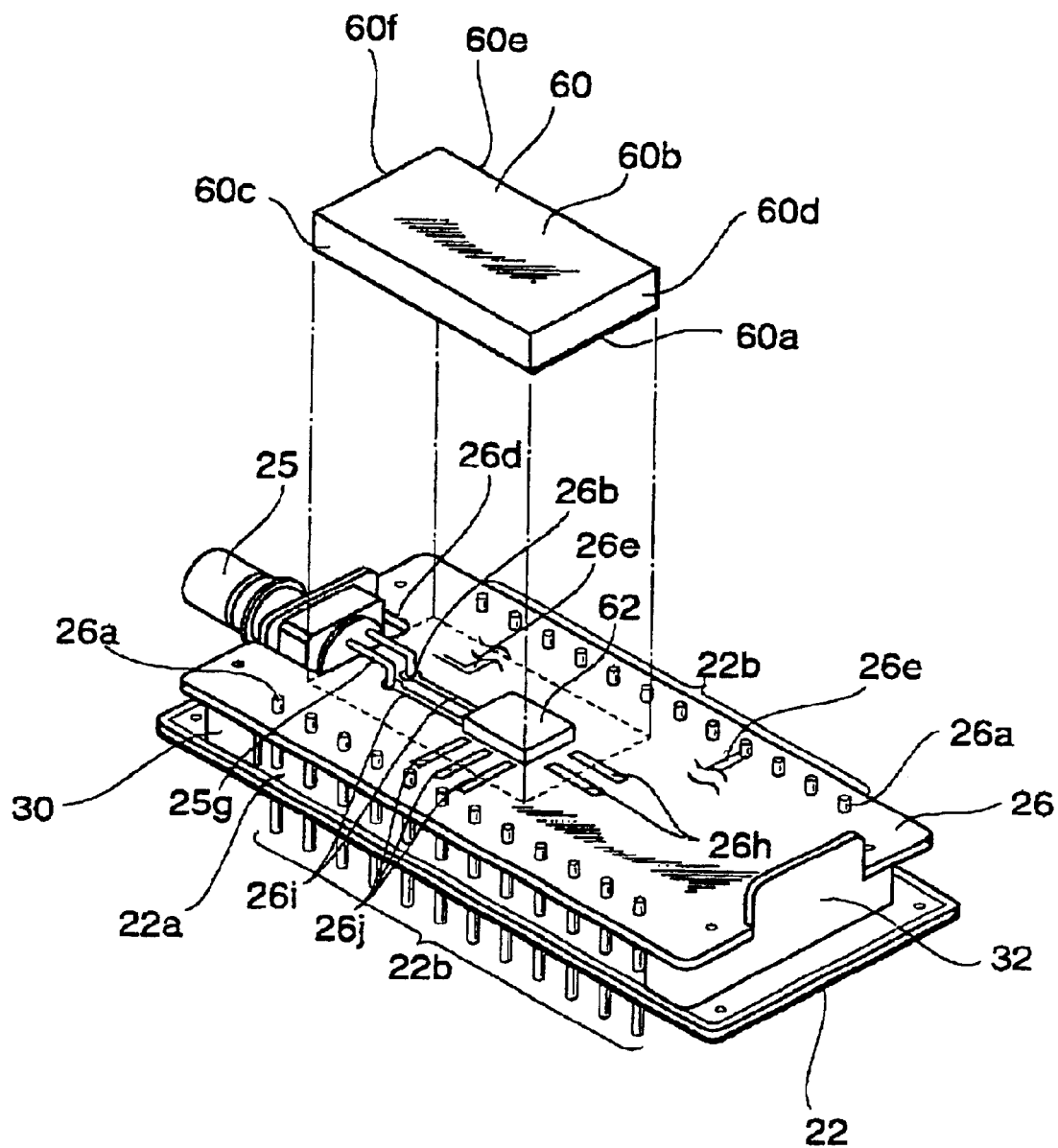
FIG. 9 is a view showing an internal structure of the optical data link according to the fourth embodiment.

FIG. 8 is a perspective view showing an optical data link in accordance with still another embodiment. FIG. 9 is a view showing an inner structure of the optical data link according to the present embodiment. Referring to FIGS. 8 and 9, the optical data link 20b is shown. The optical data link 20b comprises a mounting member 22, an optical element assembly 25, a circuit board 26, a cover member 28, and a heat transfer part 60. In the optical data link 20b, a guide member 52 such as a sleeve is disposed at the head of the optical element assembly 25. The guide member 52 is capable of guiding the ferule 56 attached on one end portion of the optical fiber 54, and enables the optical connection between the end of the optical fiber 54 and the optical element assembly 25.

The optical data link 20b comprises an optical element assembly 25 instead of the optical element assembly 24. The structure of the optical element assembly 25 may be the same as that of the optical element assembly 24 shown in FIG. 5, but is not limited thereto. The optical element assembly 25 is supported with a first support member 30. The first support member 30 is mounted on the principal surface of the mounting member 22, and positions the optical element assembly 25 on the mounting member 22 such that the optical element assembly 25 is directed in a direction of the predetermined axis. In the optical element assembly 25, terminals 25g, such as lead terminals, extend from the optical element assembly 25 along the circuit board 26, and are bent so as to pass through the through hole 22b, so that the end of the terminal 25g faces the mounting substrate 22.

For example, when the optical data link 20b works as a transmission data link, the electronic device 62 operates so as to generate a signal provided to a semiconductor light-emitting element such as a semiconductor laser element (for example, reference numeral 24e of FIG. 5 within the optical data link 20b). When the optical data link 20b works as a receiving data link, the electronic device 62 operates so as to amplify signal provided from a semiconductor light-detecting element, such as a photodiode (for example, reference numeral 24e of FIG. 5 within the optical data link 20b).

The circuit board 26 is supported by a second support member 32. The second support member 32 is disposed on the principal surface of the mounting member 22, so that a certain amount of space for arranging the electronic components is provided between the circuit board 26 and the principal surface of the mounting member 22. Moreover, the circuit board 26 may also be supported by the first support member 30. The first support member 30 is disposed on the principal surface of the mounting member 22. In this embodiment, the first support member 30 and the second support member 32 are arranged between the mounting member 22 and the circuit board 26, and define the gap between the mounting member 22 and circuit board 26.

The heat transfer part 60, as shown in FIG. 8, is positioned between the circuit board 26 and the conductive cover 28. As shown in FIG. 9, an electronic device 62 is disposed in contact with the bottom of the heat transfer part 60. The heat transfer part 60 is disposed on the circuit board 26 and is provided so as to contact the conductive cover 28 as well as to contact the conductive portion of the optical element assembly 25 and the electronic device 62. The heat transfer part 60 has a pair of faces, mutually opposed with each other, one of which realizes this contact. One of these faces, a face 60a, has an area sufficient to cover a region (dashed box shown in FIG. 9 for example) in which the electronic device 62 and the conductive pin 25g of the optical element assembly 25 are arranged. The other face, a face 60b, is provided so as to contact the inner wall of the conductive cover 28. The heat transfer part 60 serves to conduct heat from the electronic device 62 and the optical element assembly 25 to the conductive cover 28. Moreover, the heat transfer part 60 comprises side faces 60c to 60f, which are also capable of releasing the heat into the air.

In addition, the heat transfer part 60 has a thickness equivalent to or slightly larger than the distance between the circuit board 26 and the conductive cover 28. Moreover, it is preferable that the heat transfer part 60 exhibit a certain degree of flexibility sufficient to be compressed to deform between the conductive cover 28 and the electronic device 62 and optical element assembly 25 The flexibility allows the compressed heat transfer part 60 to conform to the irregular shape of the electronic device 62 and the conductive pin 25g.

The heat transfer part 60 has advantages arising from the foregoing behavior. The deformed heat transfer part 60 generates stress therein which ensures that heat transfer part 60 contacts the electronic device 62 and the optical element assembly 25 and that the area of the contact can be increased. Further, since the heat transfer part 60 deforms to conform to the external shape of the electronic device 62 and the optical element assembly 25, it is not necessary to make the heat transfer part 60 having its desired shape. In addition, the heat transfer part 60 exhibits electrical insulation such that electrical conduction will not occur between the optical element assembly 25 and the conductive cover 28 therethrough.

Because of the deformation of the heat transfer part 60, the heat transfer part 60 closely contacts the electronic device 62 and optical element assembly 25. The heat transfer part 60 causes heat from the electronic device 62 and the optical element assembly 25 to disperse and spread. The contact area of the heat transfer part 60 with the conductive cover 28 is larger than that of the electronic device 62 and optical element assembly 25 with the heat transfer part 60. This larger contact surface allows the heat to efficiently conduct to the conductive cover 28 and to be released.

Preferably, the heat transfer part 60 exhibits adhesiveness to facilitate the maintenance of the contact between the heat transfer part 60 and components contacted therewith, such as the electronic device 62, the optical element assembly 25 and the conductive cover 28.

The present inventors think as follows: the thermal conductivity of material for the heat transfer part 60 is preferably 2.0 W/m·K or more; and a silicone gel can be exemplified as material for the heat transfer part 60.

Referring to FIGS. 8 and 9, the circuit board 26 comprises wiring layers 26h, 26i and 26j connected to the electronic device 62. It is preferable that the heat transfer part 60 is in contact with at least one layer of these wiring layers 26h, 26i and 26j. If the heat transfer part 60 contacts the wiring layers 26h and 26j, the wiring layers 26h and 26j conducts heat from the electronic device 62 to the heat transfer part 60. Moreover, the wiring layer 26i on the circuit board 26 is connected to the conductive pin 25g of the optical element assembly 25 and the electronic device 62. If the heat transfer part 60 contacts this wiring layer 26i, the wiring layer 26i provides heat from both the optical element assembly 25 and the electronic device 62 with the heat transfer part 60. Thus, the thermal interference between the optical element assembly 25 and the electronic device 62 is reduced.

Figure 10:
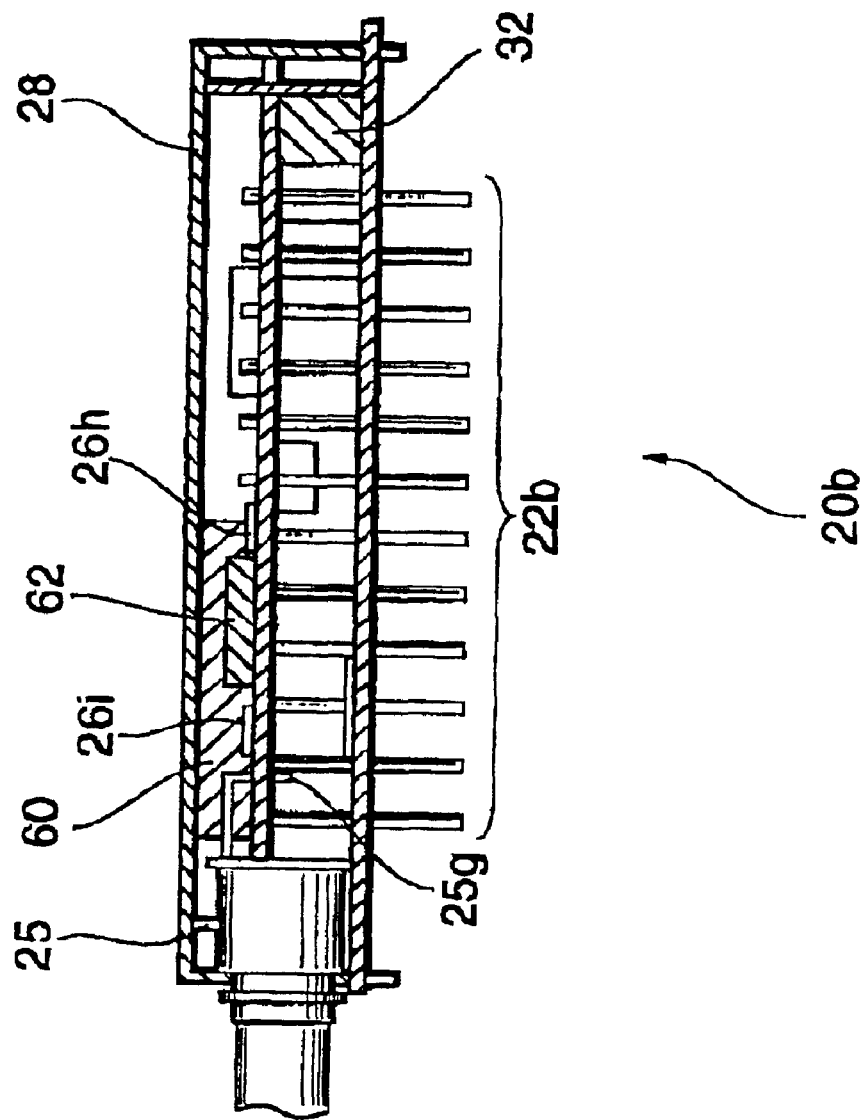
FIG. 10 is a cross sectional view, taken along the line II—II shown in FIG. 8, showing an optical data link.
Figure 11:
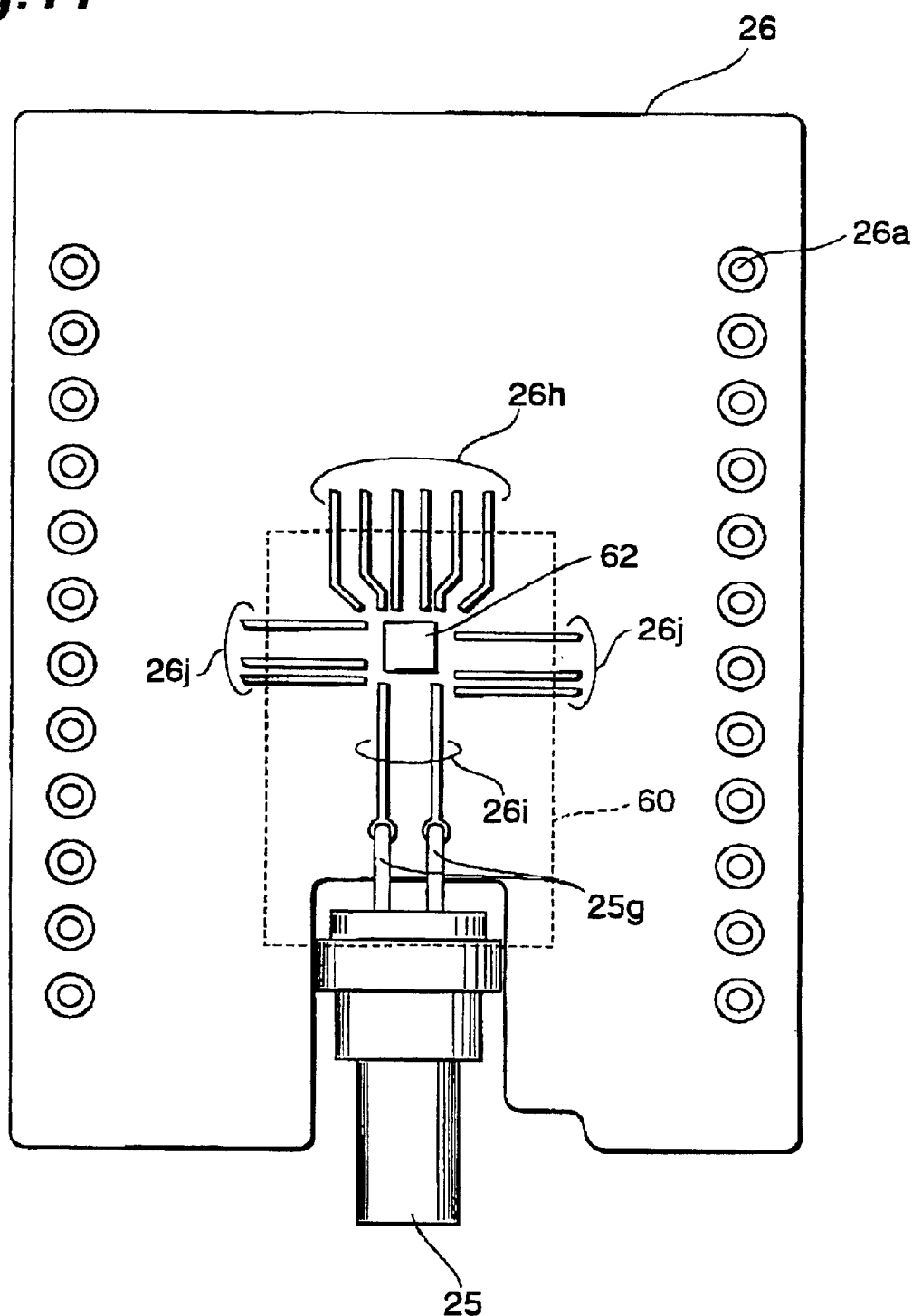
FIG. 11 is a plan view showing a circuit board for the optical data link shown in FIG. 8.

FIG. 10 is a cross sectional view, taken along line II—II illustrated in FIG. 8, showing the optical data link 20b. In this optical data link 20b, the heat transfer part 60 is provided so as to contact the upper and side surfaces of the electronic device 62. FIG. 11 is a plan view showing the circuit board 26 used in the optical data link 20b. In FIG. 11, the heat transfer part 60 is provided within an area shown by a broken line. The heat transfer part 60 is positioned so as to contact conductors such as the wiring layer 26h, 26i and/or 26j connected to the electronic device 62 while covering the electronic device 62. Further, the heat transfer part 60 is positioned so as to contact one or more conductors such as the conductive terminal 25g of the optical element assembly 25.

Figure 12A:
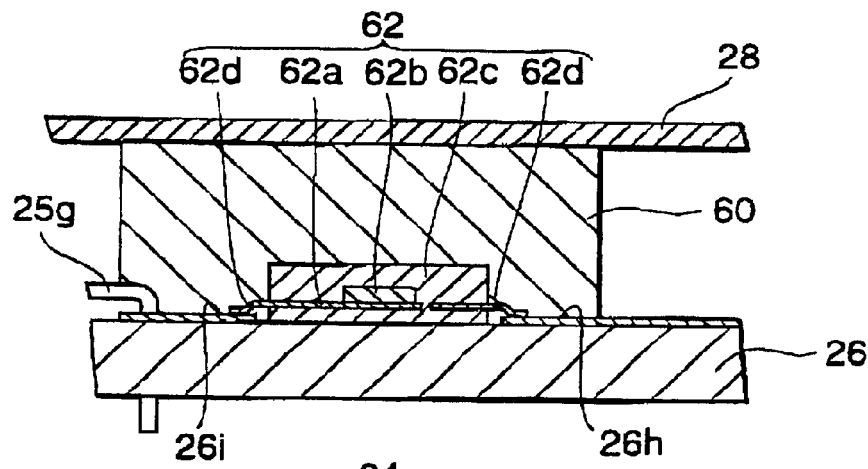
FIG. 12A is a cross sectional view, taken along a line III—III shown in FIG. 8, showing the optical data link.

FIG. 12A is a cross sectional view, taken along the line III—III illustrated in FIG. 8, showing the optical data link. FIG. 12A shows the details of the electronic device 62. The electronic device 62 comprises a lead frame 62a, a semiconductor chip 62b, and a molded resin body 62c. In the electronic device 62, a semiconductor chip 62b is disposed on the lead frame 62a, and the molded resin body 62c covers the semiconductor chip 62b.

This electronic device 62 is mounted on the circuit board 26. A part of the lead frame 62a extends from the molded resin body 62c to form the external lead terminals 62d. The external lead terminals 62d are connected to wiring layers 26h and 26i, provided on the circuit board 26, via conductive connection members such as a solder.

The heat transfer part 60 is deformed to conform to the shapes of the molded resin body 62c, external lead terminals 62d, conductive layers 26i and 26h, and optical element assembly 25 (for example, lead terminal 25g). In other words, depressed portions formed on the heat transfer part 60 correspond to the shapes of the conductive layers 26i and 26h on the circuit board 26, the external lead terminal 62d and the optical element assembly 25 (e.g., lead terminals 25g), respectively. The formation of this depressed portions enables the heat transfer part 60 to contact each of the components 62c, 62d, 62d, 25, 26i and 26h.

Figure 12B:
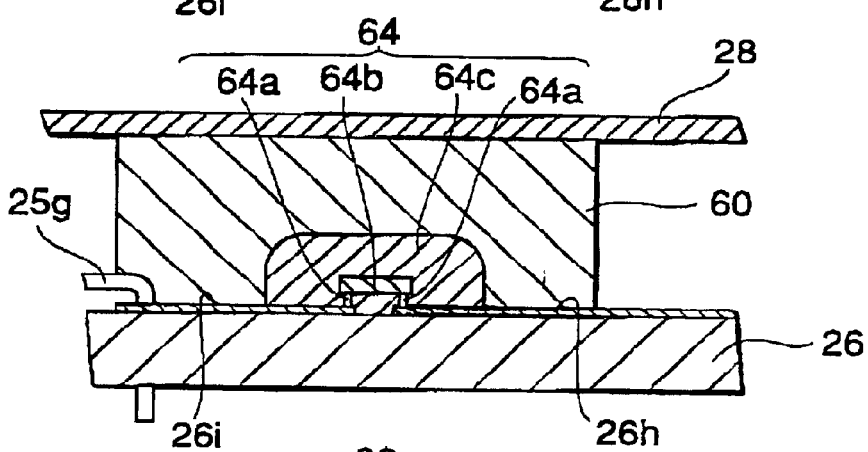
FIG. 12B is a cross sectional view, taken along a line equivalent the line III—III, showing an optical data link.

FIG. 12B is a cross section, taken along a line equivalent to the line III—III illustrated in FIG. 8, showing the optical data link according to another embodiment. FIG. 12B shows the detail of the electronic device 64 included in the optical data link of another embodiment. The electronic device 64 comprises an electrode 64a, such as a metal bump, provided on the wiring layers 26h and 26i, a semiconductor chip 64b provided on the electrode 64a, and a sealant resin portion 64c for covering the semiconductor chip 64b and the electrode 64a. In this embodiment, the semiconductor chip 64b is mounted in a flip-chip configuration, and the pad electrode on the semiconductor chip 64b is connected to the wiring layers 26i and 26h via the electrode 64a. After mounting the semiconductor chip 64a on the circuit board 26, the sealant resin portion 64c is provided by potting sealant resin material on the semiconductor chip 64a on the circuit board 26 and solidifying it.

The heat transfer part 60 is deformed to conform to the shape of the sealant resin portion 64c, the conductive layers 26i and 26h, and the lead terminal 25g. In other words, this deformation creates depressions on the heat transfer part 60 and the depressions correspond to the shape of the conductive layers 26h and 26j on the circuit board 26, the sealant resin portion 64c and the lead terminals 25g. The depressions enable the heat transfer part 60 to contact each of components 64c, 26h, 26i and 25.

Figure 12C:
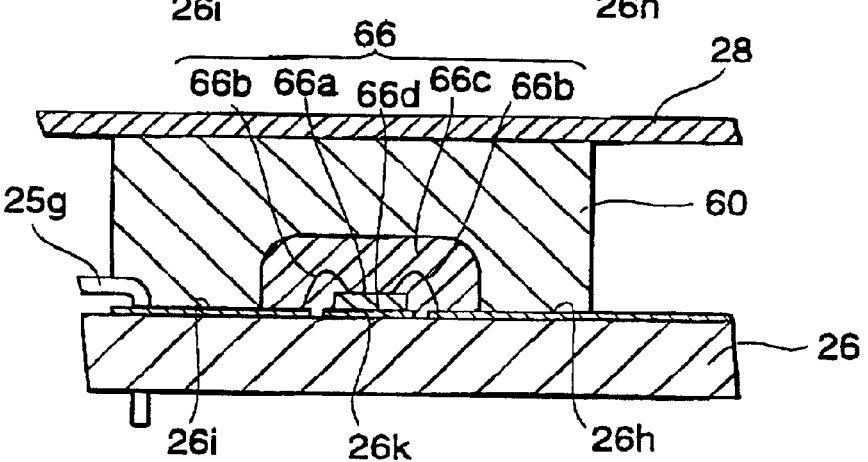
FIG. 12C is a cross sectional view, taken along a line equivalent to the line III—III, showing an optical data link.

FIG. 12C is a cross sectional view, taken along a line equivalent to the line III—III illustrated in FIG. 8, showing the optical data link of another embodiment. FIG. 12C shows the details of the electronic device 66 included in the optical data link of another embodiment.

The electronic device 66 comprises a semiconductor chip 64a, a wiring member 66b and a sealant resin portion 66c. The semiconductor chip 64a is provided on the circuit board 26. The wiring members 66b connect the pad electrodes on the semiconductor chip 64a with the wiring layers 26h and 26i, for example, by wire bonding. The sealant resin portion 66c covers the semiconductor chip 66a and the wiring members 66b.

In this embodiment, the semiconductor chip 66a has a metal layer on the face (back side) opposed to the front face on which active elements, such as transistors, are provided, and this metal layer on the back side is bonded with the metal layer 26k on the circuit board via an adhesive member 66d. After the semiconductor chip 66a is mounted on the circuit board 26 and the wire bonding is completed, the sealant resin portion 66c is formed by potting a sealant resin on the semiconductor chip 64a and the circuit board 26 and solidifying it.

The heat transfer part 60 is deformed to conform to the shapes of the sealant resin portion 66c, conductive layers 26i and 26h, and the lead terminal 25g. In other words, this deformation creates depressed portions formed on the heat transfer part 60, and the shapes of the depressions are associated with the shapes of the conductive layers 26i and 26h on the circuit board 26, the sealant resin portion 66c and the lead terminal 25g, respectively. The formation of this depressed portions enable the connection of the heat transfer part 60 with each of components 66c, 26i, 26h and 25.

In the respective embodiments illustrated in FIGS. 12A to 12C, each of the sealant resin body 62c and the sealant resin portions 64c and 66c works as a protective member for protecting the semiconductor chip. Moreover, the heat transfer part 60 exhibits electric insulation to avoid the generation of a conductive path through the heat transfer part 60 among the optical element assembly 25, the conductive layers 26h, 26i, 26j and the conductive cover 28

Fifth Embodiment

FIG. 13 is a cross sectional view, taken along a line equivalent to the line II—II illustrated in FIG. 8, showing the optical data link 20c. In the optical data link 20c, the electronic device 62 is positioned between the circuit board 26 and the mounting substrate 22, and is mounted on the mounting area on one face, face 26g, of the circuit board 26. The circuit board 26 comprises a plurality of thermal vias 26m provided to the mounting region. Each of said thermal vias 26m extends from one face of the circuit board 26 to the other face, and is made of material exhibiting a better thermal conductivity than that of the circuit board 26. The thermal vias 26m are provided in contact the rear face of the electronic device 62. Meanwhile, the heat transfer part 61 is provided between the wiring member 26 and the conductive cover 28, and is in contact with both the mounting region of the wiring member 26 and the conductive cover 28. Thus, heat is generated in the electronic device 62, and the heat is conducted to the conductive cover 28 via the thermal via 26m and the heat transfer part 61 and then is released from the conductive cover 28.

Moreover, the heat transfer part 61 is provided so as to contact conductors such as the conductive pins 25g of the optical element assembly 25. Thus, the heat transfer part 61 works to conduct the heat from the electronic device 62 and the optical element assembly 25 to the conductive cover 28.

It is preferable that the heat transfer part 61 exhibit a certain degree of flexibility sufficient to deform to conform to the shape of the optical element assembly 25 when disposed between the conductive cover 28 and the optical element assembly 25.

The heat transfer part 61 exhibits electric insulation so as to avoid the generation of a conductive path therethrough between the optical element assembly 25 and the conductive cover 28.

Sixth Embodiment

Figure 14:
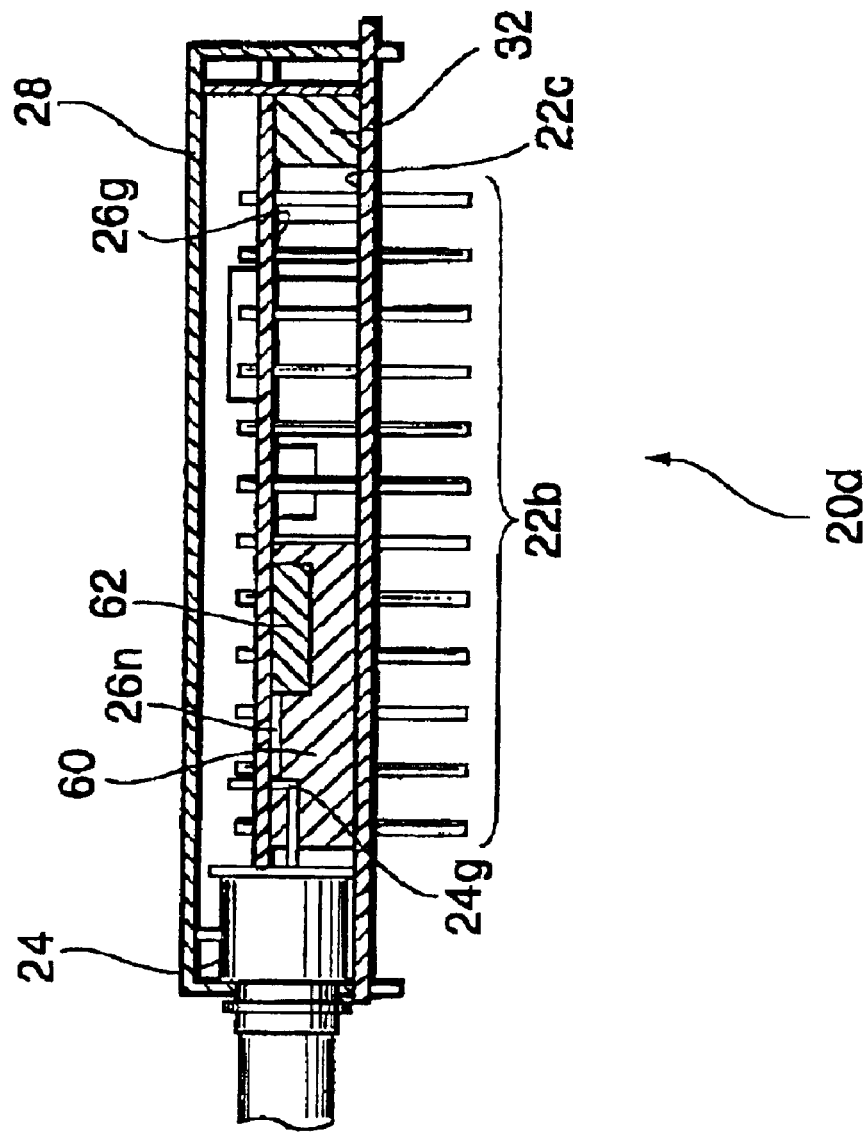
FIG. 14 is a cross sectional view, taken along a line equivalent to the line II—II shown in FIG. 8, showing an optical data link.
Figure 15A:
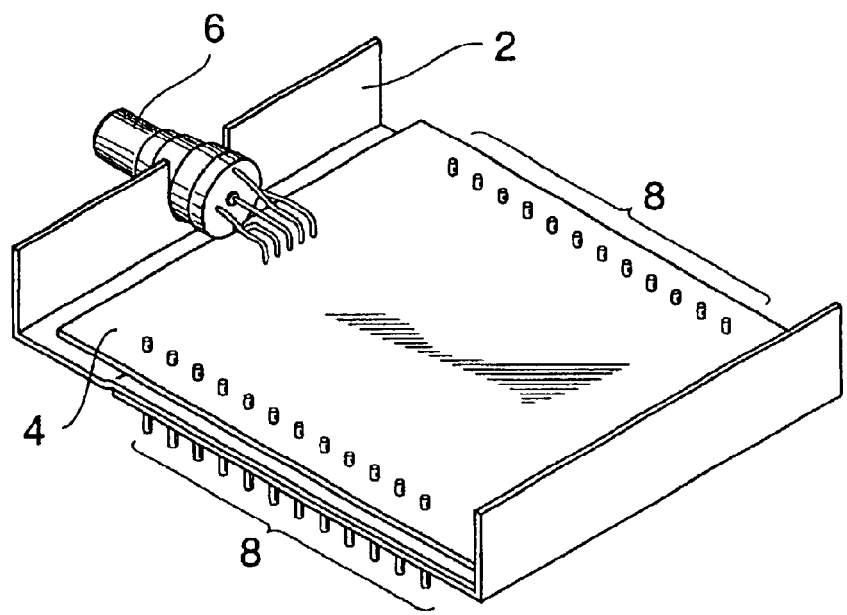
FIGS. 15A and 15B are views showing an optical data link for comparison with the optical data link of the present invention.
Figure 15B:
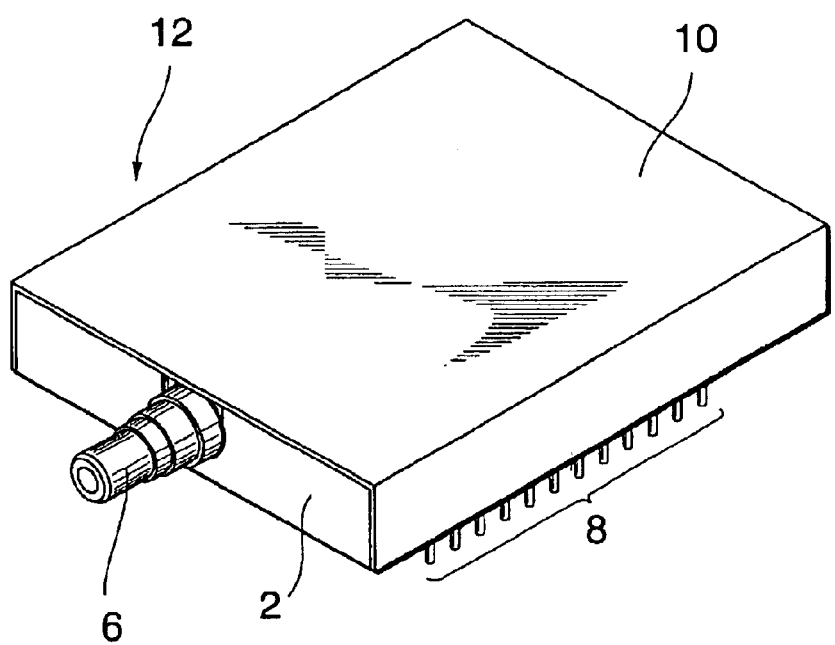
Figure 16A:
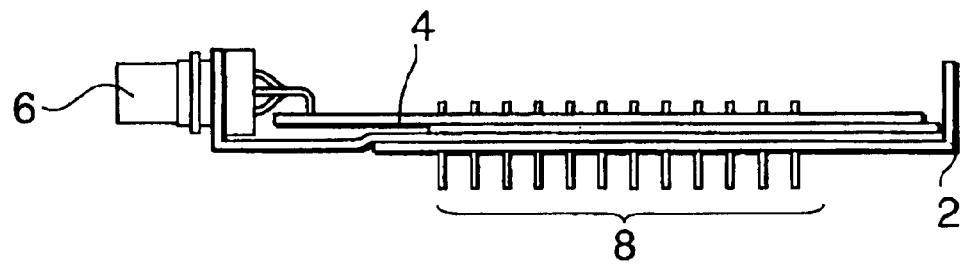
FIG. 16A is a view showing an optical data link for comparison with the optical data link of the present invention.
Figure 16B:
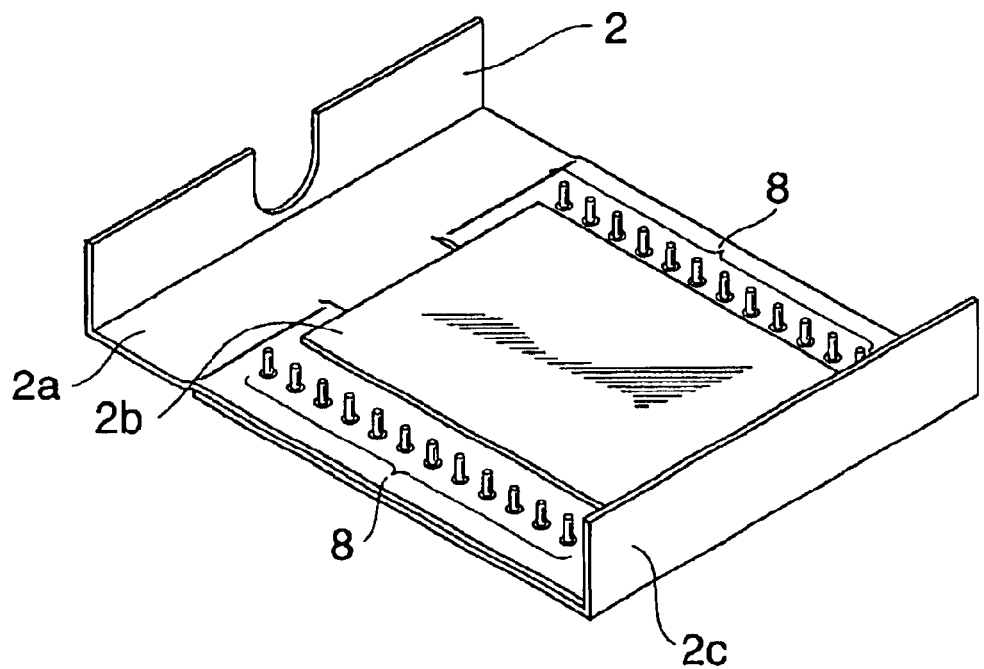
FIG. 16B is a view showing sheet metal parts for the optical data link for comparison with the optical data link of the present invention.

FIG. 14 is a cross sectional view, taken along a line equivalent to the line II—II illustrated in FIG. 8, showing the optical data link 20d. In the optical data link 20d, the electronic device 62 is mounted on the mounting region on one side, the face 26g, of the circuit board 26, and is positioned between the circuit board 26 and the mounting substrate 22. Meanwhile, the heat transfer part 60 is positioned between the wiring member 26 and the mounting member 22, and is in contact with the wiring member 26, electronic device 62 and mounting member 22. Thus, heat is generated in the electronic device 62 and the generated heat is conducted to the mounting member 22 via the heat transfer part 60, and then is released from the mounting member 22.

Moreover, the heat transfer part 60 is provided so as to contact the conductors of the optical element assembly 24, such as the conductive pins 24g. Furthermore, a wiring layer 26n is provided on the face 26g of the circuit board 26 and is connected to the electronic component 62. Thus, the heat transfer part 60 works to conduct the heat from the wiring layer 26n, the electronic device 62 and the optical element assembly 24 to the mounting member 22.

It is preferable that the heat transfer part 60 exhibit a certain degree of flexibility. Due to the flexibility, the heat transfer part 60 is capable of deforming to conform to the shapes of electronic device 62 and the optical element assembly 24 when disposed between the mounting member 22 and electronic device 62 and optical element assembly 24.

The heat transfer part 60 provides electric insulation so as to avoid the generation of a conductive path therethrough between the optical element assembly 24, conductive film 22c on the mounting member 22, and the wiring layer 26n on the circuit board 26.

As described above, the heat transfer part is capable of providing one or more heat-generating sources within the optical data link with a new heat-release path. The new path prevents components in the optical data link from exhibiting its thermal runaway. Thus, the new path allows the optical data links in the embodiments to operate in the wider range of the operating temperature. Further, the optical data link in the present embodiments show favorable transmission waveform even in high temperatures.

As described in the foregoing, the optical data link in accordance with the present invention has support means for supporting a circuit board so as to be away from a mounting member. Since the circuit board is distanced from the mounting member, electronic components can be mounted on both surfaces of the circuit board.

Therefore, an optical data link having a structure capable of increasing the area for mounting electronic components are provided.

Although the principle of the present invention is illustrated and explained in preferred embodiments, those skilled in the art can recognize that the present invention can be modified in its arrangement and details without departing from the principle. The circuit board is supported by the support member in the embodiments, but the circuit board may be supported by the electrically conductive pin while being distanced from the substrate of the mounting member, for example. Also, any structure allowing the circuit board to be distanced from the substrate of the mounting member can be employed without being limited to the specific configurations disclosed in the embodiments. Therefore, we claim rights for all the modifications and changes from the scope of claims and the spirit.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An optical data link comprising:
  a mounting member having a substrate with a plurality of holes, and a plurality of electrically conductive pins passing through said plurality of holes of said substrate;

a circuit board having a pair of surfaces with an electrically conductive layer connected to at least one pin of said plurality of electrically conductive pins, each of said pair of surfaces mounting an electronic component;

an optical element assembly, mounted on said mounting member, including a semiconductor optical element connected to said electrically conductive layer provided on said circuit board;

a first support member located along one side of said circuit board and being provided between said circuit board and said mounting member for supporting said circuit board, said first support member having a thickness substantially equal to an interval between said circuit board and said mounting member; and a second support member located along an opposite side of said circuit board and being provided between said circuit board and said mounting member for supporting said circuit board, said second support member having a thickness substantially equal to said interval between said circuit board and said mounting member;

wherein said circuit board has a cutout so as to receive a tail of said optical element assembly, said first support member holding said optical element assembly on two sides.

2. The optical data link according to claim 1, further comprising an electrically conductive cover, said cover covering said circuit board, wherein said circuit board is provided such that one of said pair of surfaces thereof faces a main surface of said mounting member, and wherein said mounting member has an electrically conductive film on said main surface of said mounting member.

3. The optical data link according to claim 2, wherein said mounting member has an insulating member provided along a surface of said mounting member, said surface of said mounting member being opposed to said main surface of said mounting member.

4. The optical data link according to claim 1, wherein said mounting member has a hole for accommodating a part of said electronic component mounted on one of the surfaces of said circuit board.

5. The optical data link according to claim 1, wherein said circuit board has a plurality of holes, said plurality of conductive pins being inserted into said plurality of holes.

* * * * *